(12) United States Patent
Park et al.

(10) Patent No.: US 9,214,497 B2
(45) Date of Patent: Dec. 15, 2015

(54) ORGANIC LIGHT EMITTING DISPLAY DEVICE AND METHOD OF MANUFACTURING THE SAME

(71) Applicant: LG DISPLAY CO., LTD., Seoul (KR)

(72) Inventors: Jinho Park, Paju-si (KR); Kwansoo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/549,194

(22) Filed: Nov. 20, 2014

(65) Prior Publication Data

US 2015/0099322 A1     Apr. 9, 2015

Related U.S. Application Data

(62) Division of application No. 13/921,883, filed on Jun. 19, 2013, now Pat. No. 8,921,842.

(30) Foreign Application Priority Data

Nov. 14, 2012  (KR) .......................... 10-2012-0128572
May 21, 2013   (KR) .......................... 10-2013-0057335

(51) Int. Cl.
| | |
|---|---|
| *H01L 51/50* | (2006.01) |
| *H01L 27/32* | (2006.01) |
| *H01L 51/52* | (2006.01) |
| *H01L 51/56* | (2006.01) |

(52) U.S. Cl.
CPC ........ *H01L 27/3209* (2013.01); *H01L 27/3213* (2013.01); *H01L 51/504* (2013.01); *H01L 51/5044* (2013.01); *H01L 51/5056* (2013.01); *H01L 51/5088* (2013.01); *H01L 51/52* (2013.01); *H01L 51/56* (2013.01)

(58) Field of Classification Search
CPC ............ H01L 51/5044; H01L 27/3213; H01L 51/504; H01L 51/5036; H01L 51/5265; H01L 27/3211
See application file for complete search history.

(56) References Cited

U.S. PATENT DOCUMENTS

| | | | |
|---|---|---|---|
| 2010/0133994 | A1 | 6/2010 | Song et al. |
| 2011/0121753 | A1 | 5/2011 | Nagayama et al. |
| 2011/0180825 | A1* | 7/2011 | Lee et al. .......... 257/89 |
| 2012/0299002 | A1 | 11/2012 | Kinoshita |
| 2013/0140533 | A1* | 6/2013 | Lee et al. .......... 257/40 |
| 2013/0140535 | A1 | 6/2013 | Chu et al. |
| 2014/0209870 | A1 | 7/2014 | Shim et al. |

\* cited by examiner

*Primary Examiner* — Jae Lee
*Assistant Examiner* — Mohammed R Alam
(74) *Attorney, Agent, or Firm* — Brinks Gilson & Lione

(57) ABSTRACT

An organic light emitting display device includes a substrate and a plurality of pixels defined in the substrate. A pixel includes red subpixel, green subpixel, blue subpixel, and white subpixel. The organic light emitting display device includes an anode electrode formed on the substrate, a cathode electrode opposing the anode electrode, and a red common emission layer, a green common emission layer, and a blue common emission layer formed across each of the red, green, blue and white subpixel areas. The blue common emission layer is disposed above and adjacent to the anode electrode, the green common emission layer is disposed above the blue common emission layer, and the red common emission layer is disposed above the green common emission layer and adjacent to the cathode electrode.

12 Claims, 7 Drawing Sheets operation of red operation of green

ORGANIC LIGHT EMITTING DISPLAY DEVICE AND METHOD OF MANUFACTURING THE SAME

CROSS-REFERENCE TO RELATED APPLICATIONS

The present patent document is a divisional of U.S. patent application Ser. No. 13/921,883, filed Jun. 19, 2013, which claims the benefit of the Korean Patent Application Nos. 10-2012-0128572 filed on Nov. 14, 2012, and 10-2013-0057335 filed on May 21, 2013, which is hereby incorporated by reference as if fully set forth herein.

BACKGROUND

1. Field of the Invention

The present invention relates to an organic light emitting display device and a method of manufacturing the same.

2. Discussion of the Related Art

As a type of new flat panel display device, organic light emitting display devices are self-emitting display devices, and have a better viewing angle and contrast ratio than liquid crystal display (LCD) devices. Also, since the organic light emitting display devices do not need a separate backlight, the organic light emitting display devices can be made lighter and thinner with excellent power consumption compared to LCD devices and the other flat panel display devices. Furthermore, the organic light emitting display devices are driven with a low direct current (DC) voltage, have a fast response time, and are low in manufacturing cost.

In organic light emitting display devices, an electron and a hole are respectively injected from a cathode and an anode into an emitting material layer, and, when an exciton in which the injected electron and hole are combined is shifted from an excited state to a base state, light is emitted. In this case, the types of organic light emitting display devices are categorized into a top emission type, a bottom emission type, and a dual emission type according to an emission direction of light, and categorized into a passive matrix type and an active matrix type according to a driving type.

Specifically, the organic light emitting display device includes a first electrode (anode), a hole transporting layer, an emitting material layer including a red organic emission pattern, a green organic emission pattern, and a blue organic emission pattern, an electron transporting layer, and a second electrode (cathode), which are formed in each of a red pixel area, a green pixel area, and a blue pixel area.

In the organic light emitting display devices having such structure, when a voltage is applied to the first and second electrodes, a hole moves to the emitting material layer through the hole transporting layer, an electron moves to the emitting material layer through the electron transporting layer, and the hole and the electron are combined in the emitting material layer, thereby emitting light.

In the organic light emitting display devices, a fine metal mask (FMM) process is used for patterning the emitting material layer between two electrodes disposed on a substrate. Numerous FMM processes may be performed to manufacture an organic light emitting display device. When FMM processes are applied to different pixels, a fine metal mask needs to be moved and aligned for different pixels. During that process, the fine metal mask may not be properly aligned which may cause certain defects. Also, each FMM process may require alignment of a mask over different pixels of an organic light emitting display device. Such alignment may require substantial time and labor, which adds manufacturing expenses and lengthens manufacturing time. Moreover, a mask used in FMM processes is costly. Accordingly, there is a need to reduce a number of FMM process and simplify manufacturing processes.

SUMMARY

Accordingly, an organic light emitting display device and a method of manufacturing the same that substantially obviate one or more problems due to limitations and disadvantages of the related art may be provided.

An aspect of the present invention is directed to a high-efficiency white organic light emitting display device (WOLED) that has a structure which emits red, green, blue, and white light by forming red, green, and blue emitting material layers as a common layer, realizes excellent light output efficiency, maintains a color characteristic, and enables the simplification of a process and the saving of the manufacturing cost.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, An organic light emitting display device includes a substrate and a plurality of pixels defined in the substrate. A pixel includes red subpixel, green subpixel, blue subpixel, and white subpixel. The organic light emitting display device includes an anode electrode formed on the substrate, a cathode electrode opposing the anode electrode, and a red common emission layer, a green common emission layer, and a blue common emission layer formed across each of the red, green, blue and white subpixel areas. The blue common emission layer is disposed above and adjacent to the anode electrode, the green common emission layer is disposed above the blue common emission layer, and the red common emission layer is disposed above the green common emission layer and adjacent to the cathode electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
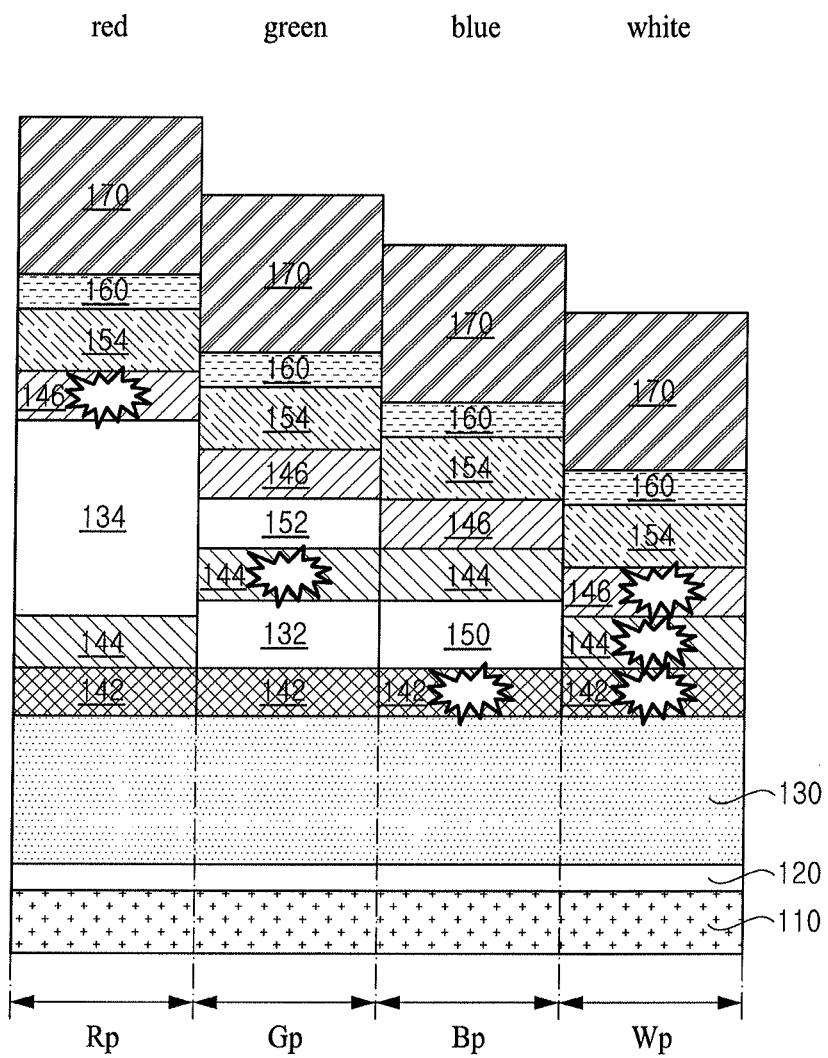
FIG. 1 illustrates a conventional organic light emitting display device.

Hereinafter, embodiments of the present invention will be described in detail with reference to the accompanying drawings. Like reference numerals refer to like elements throughout. In the following description, when the detailed description of the relevant known function or configuration is determined to unnecessarily obscure the important point of the present invention, the detailed description is not provided.

FIG. 1 is a sectional view schematically illustrating an organic light emitting display device according to one embodiment of the present invention. As illustrated in FIG. 1, the organic light emitting display device includes a first electrode (anode) 110, a hole injection layer 120, a first hole transporting layer 130, a blue common emission layer 142, a second hole transporting layer 132, a first electron transporting layer 150, a green common emission layer 144, a third hole transporting layer 134, a second electron transporting layer 152, a red common emission layer 146, a third electron transporting layer 154, a second electrode (cathode) 160, and a capping layer 170 that are sequentially applied on a substrate (not shown) in which red, green, blue, and white pixel areas Rp, Gp, Bp and Wp are defined.

Although not shown, in the organic light emitting display device, a plurality of gate lines and a plurality of data lines, which define a plurality of pixel areas Rp, Gp, Bp and Wp by intersections therebetween, and a plurality of power lines that extend parallel to respective corresponding lines among the gate lines and the data lines are disposed on the substrate (not shown). A switching thin film transistor (TFT) connected to a corresponding gate line and data line and a driving TFT connected to the switching TFT are disposed in each of the pixel areas Rp, Gp, Bp and Wp. Here, the driving TFT is connected to the first electrode 110.

In an embodiment, the organic light emitting display device includes an organic layer between the first electrode 110 and the second electrode 160 facing the first electrode 110, the hole injection layer 120, the first hole transporting layer 130, the second hole transporting layer 132, the third hole transporting layer 134, the blue common emission layer 142, the green common emission layer 144, the red common emission layer 146, the first electron transporting layer 150, the second electron transporting layer 152, and the third electron transporting layer 154.

The first electrode 110 is formed in a plate shape in the red, green, blue, and white pixel areas Rp, Gp, Bp and Wp, in the substrate (not shown). The first electrode 110 is a reflective electrode, and for example, may have a multi-layer structure that includes a transparent conductive material layer (having a high work function) such as indium tin oxide (ITO) and a reflective material layer such as Ag or an Ag alloy.

The hole injection layer 120, the first hole transporting layer 130, and the blue common emission layer 142 are formed on the first electrode 110 in respective positions corresponding to the red, green, blue, and white pixel areas Rp, Gp, Bp and Wp. The first hole transporting layer 130 may be called a common layer, and the hole injection layer 120 may not be provided. A thickness of the hole injection layer 120 and first hole transporting layer 130 may be about 10 to 50 nm, but may be adjusted in consideration of a hole injection characteristic and a hole transport characteristic.

The second hole transporting layer 132 is formed on the blue common emission layer 142 at a position corresponding to the green pixel area Gp. That is, the second hole transporting layer 132 is formed between the blue common emission layer 142 and the green common emission layer 144. A thickness of the second hole transporting layer 132 may be about 50 to 100 nm, but may be adjusted in consideration of a hole transport characteristic. Alternatively, the second hole transporting layer 132 may not be provided.

The third hole transporting layer 134 is formed on the green common emission layer 144 at a position corresponding to the red pixel area Rp. That is, the third hole transporting layer 134 is formed between the green common emission layer 144 and the red common emission layer 146. A thickness of the third hole transporting layer 134 may be about 100 to 200 nm, but may be adjusted in consideration of a hole transport characteristic. Alternatively, the third hole transporting layer 134 may not be provided.

In one embodiment, a thickness of the third hole transporting layer 134 may be greater than that of the second hole transporting layer 132, but the thickness of the third hole transporting layer 134 is not limited thereto.

An emitting material layer including the blue common emission layer 142, the green common emission layer 144, and the red common emission layer 146 is formed at a position corresponding to the red, green, blue, and white pixel areas Rp, Gp, Bp and Wp. That is, the emitting material layer is formed as a common layer in each of the pixel areas including the white pixel areas Wp, and thus may be formed even without a fine metal mask (FMM).

In one embodiment, the blue common emission layer 142 is formed on the first hole transporting layer 130. The green common emission layer 144 is formed on the blue common emission layer 142, the second hole transporting layer 132 that is disposed at a position corresponding to the green pixel area Gp, and the first electron transporting layer 150 that is disposed at position corresponding to the blue pixel area Bp. The red common emission layer 146 is formed on the green common emission layer 144 that are disposed at respective positions corresponding to the blue and white pixel areas Bp and Wp, the third hole transporting layer 134 that is disposed at a position corresponding to the red pixel area Rp, and the second electron transporting layer 152 that is disposed at a position corresponding to the green pixel area Gp. A thickness of the blue, green, and red common emission layers 142, 144 and 146 may be about 10 to 50 nm, but may be adjusted in consideration of an emission characteristic.

The first electron transporting layer 150 is formed on the blue common emission layer 142 at a position corresponding to the blue pixel area Bp. That is, the first electron transporting layer 150 is formed between the blue common emission layer 142 and the green common emission layer 144. A thickness of the first electron transporting layer 150 may be about 10 to 50 nm, but may be adjusted in consideration of an electron transport characteristic. Alternatively, the first electron transporting layer 150 may not be provided.

The second electron transporting layer 152 is formed on the green common emission layer 144 at a position corresponding to the green pixel area Gp. That is, the second electron transporting layer 152 is formed between the green common emission layer 144 and the red common emission layer 146. A thickness of the second electron transporting layer 152 may be about 10 to 50 nm, but may be adjusted in consideration of an electron transport characteristic. Alternatively, the second electron transporting layer 152 may not be provided.

The third electron transporting layer 154 is formed on the red common emission layer 146 at a position corresponding to the red, green, blue, and white pixel areas Rp, Gp, Bp and Wp, and thus may be called a common layer. A thickness of the third electron transporting layer 154 may be about 25 to 35 nm, but may be adjusted in consideration of an electron transport characteristic. The third electron transporting layer 154 may act as an electron transport and injection layer, but an electron injection layer may be separately formed on the third electron transporting layer 154.

The second electrode 160 is formed on the third electron transporting layer 154. For example, the second electrode 160 is formed of an alloy (Mg:Ag) of Mg and Ag, and has semi-transmissive characteristic. That is, light emitted from the red, green, and blue common emission layers is transferred to the outside through the second electrode 160, in which some of the light is again transferred to the first electrode 110 because the second electrode 160 has a semi-transmissive characteristic.

Therefore, repetitive reflection is performed between the first electrode 110 (acting as a reflective electrode) and the second electrode 160. This is called the micro-cavity effect. That is, light is repeatedly reflected in a cavity between an anode (which is the first electrode 110) and a cathode that is the second electrode 160, thereby increasing light efficiency.

In this case, light respectively emitted from the blue, green, and red common emission layers 142, 144 and 146 has different wavelengths, and thus, a thickness "d" of a cavity defined as a distance between the first and second electrodes 110 and 160 is differently set. That is, the thickness "d" of the green pixel area Gp is less than that of the red pixel area Rp that emits red light having the longest wavelength, and greater than that of the blue pixel area Bp that emits blue light having the shortest wavelength. Also, to emit white light, the white pixel area Wp has a thickness less than the blue pixel area Bp.

In the present invention, a thickness in each pixel area, namely, a distance between the first and second electrodes 110 and 160 can be varied by adjusting the respective thicknesses of the second and third hole transporting layers 132 and 134, and the first and second electron transporting layers 150 and 152. As a result, in the present invention, the thickness of the third hole transporting layer 134 is greater than the sum of thicknesses of the second hole transporting layer 132 and second electron transporting layer 152, and the thickness of the first electron transporting layer 150 is less than the sum of thicknesses of the second hole transporting layer 132 and second electron transporting layer 152.

The capping layer 170 increases a light extraction effect, and may be formed of one of materials of the first to third hole transporting layers 130, 132 and 134, materials of the first to third electron transporting layer 150, 152 and 154, and host materials of the blue, green, and red common emission layers 142, 144 and 146. Alternatively, the capping layer 170 may not be provided.

As described above, the organic light emitting display device according to one embodiment of the present invention maintains light output efficiency and color characteristic, and simultaneously realizes a high-quality image.

Meanwhile, to form a material pattern in each of the pixel areas Rp, Gp, Bp and Wp, the FMM having an opening is used in correspondence with each pixel area. In this case, processes using the FMM in separate chambers are needed for forming the second and third hole transporting layers 132 and 134 and the first and second electron transporting layer 150 and 152 that have different thicknesses.

First, the first electrode 110 is formed, and then, the hole injection layer 120 and the first hole transporting layer 130 are formed without the FMM in a first chamber. The hole injection layer 120 may be formed by doping a P-type dopant, for example, boron (B) into the material of the first hole transporting layer 130. Subsequently, the blue common emission layer 142 is formed of a blue organic material with no FMM in a second chamber.

Subsequently, the second hole transporting layer 132 is formed in the green pixel area Gp using a first FMM in a third chamber. The second hole transporting layer 132 may be formed by doping the P-type dopant, for example, boron (B) into the material of the first hole transporting layer 130. Subsequently, the third hole transporting layer 134 is formed in the blue pixel area Bp using a second FMM in a fourth chamber. The third hole transporting layer 134 may be formed by doping an N-type dopant, for example, phosphorous (P) into the material of the third electron transporting layer 154. Subsequently, the green common emission layer 144 is formed of a green organic material with no FMM in a fifth chamber.

Subsequently, the third hole transporting layer 134 is formed in the red pixel area Rp using a third FMM in a sixth chamber. The third hole transporting layer 134 may be formed by doping the P-type dopant, for example, boron (B) into the material of the first hole transporting layer 130. Subsequently, the second electron transporting layer 152 is formed in the green pixel area Gp using a fourth FMM in a seventh chamber. The second electron transporting layer 152 may be formed by doping the N-type dopant, for example, phosphorous (P) into the material of the third electron transporting layer 154.

Subsequently, the red common emission layer 146 is formed of a red organic material with no FMM in an eighth chamber. Finally, the third electron transporting layer 154, the second electrode 160, and the capping layer 170 are sequentially formed with no FMM in ninth to eleventh chambers, respectively.

That is, processes may be performed using four FMMs in a total of eleven chambers, for implementing the micro-cavity structure. As described above, the organic light emitting display device according to one embodiment of the present invention can solve problems due to a defective mask, simplify a process, and save the manufacturing cost.

Figure 2A:
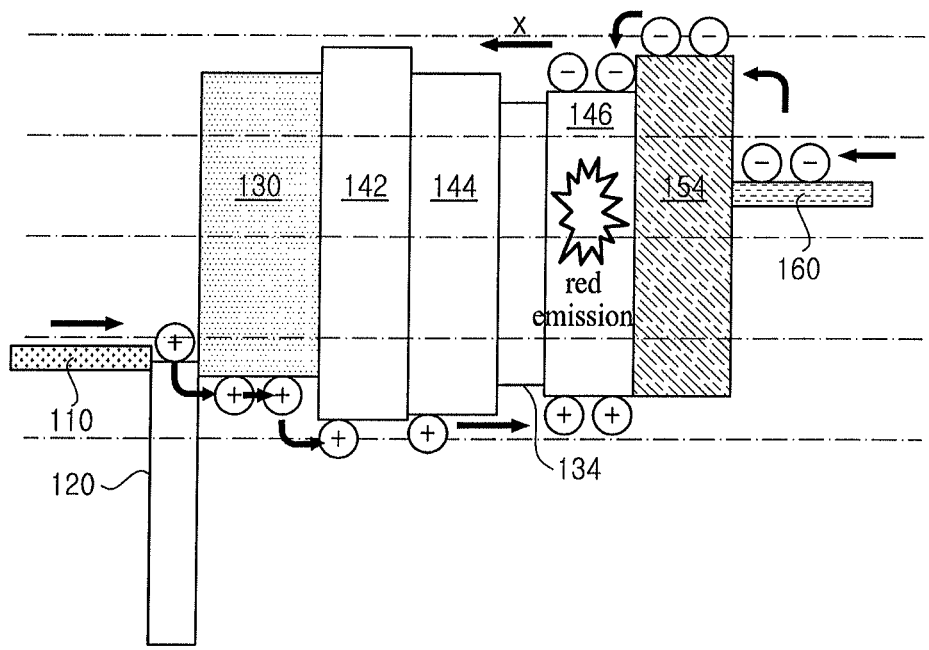
FIGS. 2A to 2D are views illustrating an energy band diagram of an organic light emitting display device according to one embodiment of the present invention.
Figure 2B:
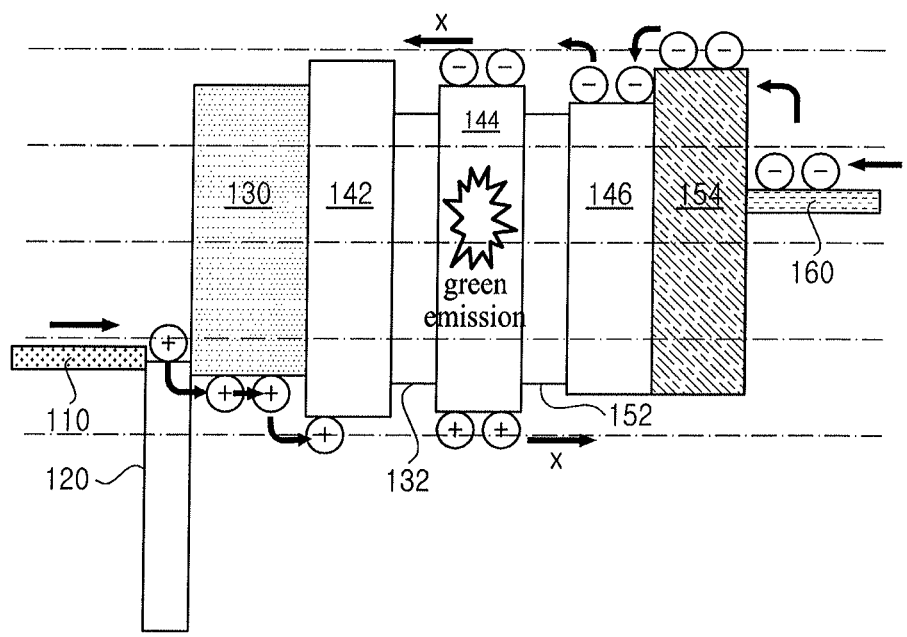
Figure 2C:
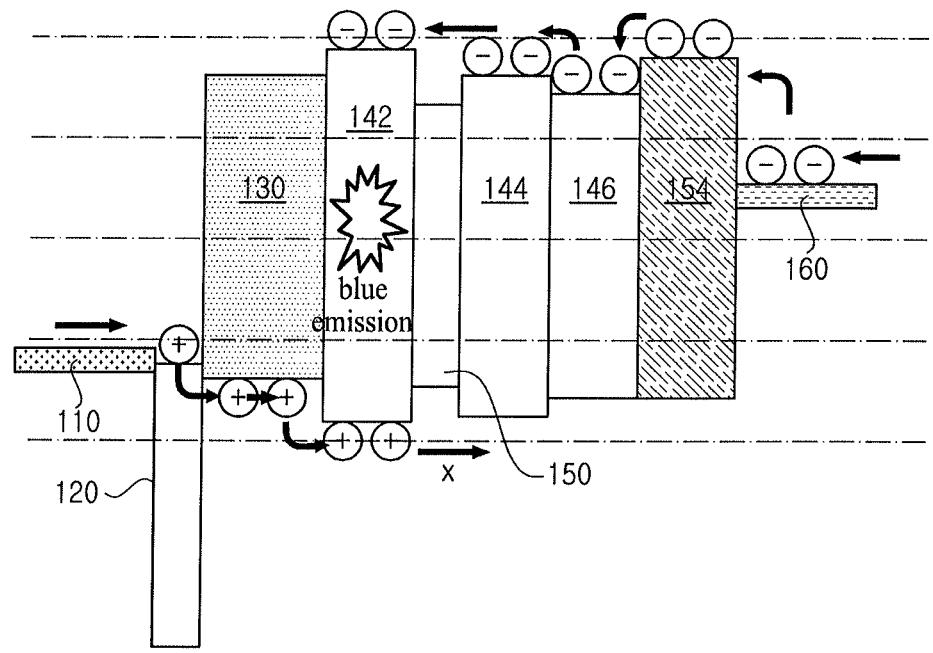
Figure 2D:
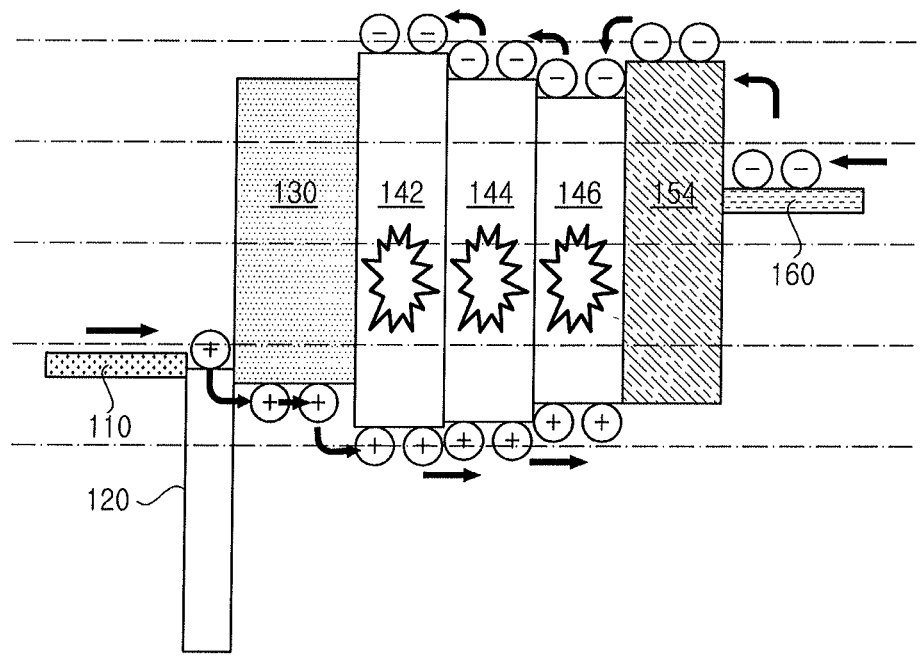

FIGS. 2A to 2D are views illustrating an energy band diagram of an organic light emitting display device according to one embodiment of the present invention. Here, FIG. 2A is a view illustrating red emission, FIG. 2B is a view illustrating green emission, FIG. 2C is a view illustrating blue emission, and FIG. 2D is a view illustrating white emission.

Generally, a hole is injected from the first electrode 110, and an electron is injected from the second electrode 160. Thus, the hole and the electron are combined to form an axciton in an emission layer, and when the axciton is shifted from an excited state to a base state, light corresponding to energy is emitted as visible light.

As illustrated in FIG. 2A, the hole injected from the first electrode 110 and the electron injected from the second electrode 160 are combined to form the exciton in the red common emission layer 146, thereby emitting red light. At this time, since transfer of the electron injected from the second electrode 160 is completely prevented by the third hole transporting layer 134, light is not emitted from the green common emission layer 144 or the blue common emission layer 142, and only the red common emission layer 146 emits light.

As illustrated in FIG. 2B, the hole injected from the first electrode 110 and the electron injected from the second electrode 160 are combined to form the exciton in the green common emission layer 144, thereby emitting green light. At this time, since transfer of the electron injected from the second electrode 160 is completely prevented by the second hole transporting layer 132 and transfer of the hole injected from the first electrode 110 is completely prevented by the second electron transporting layer 152, light is not emitted from the red common emission layer 146 or the blue common emission layer 142, and only the green common emission layer 144 emits light.

As illustrated in FIG. 2C, the hole injected from the first electrode 110 and the electron injected from the second electrode 160 are combined to form the exciton in the blue common emission layer 142, thereby emitting blue light. At this time, since transfer of the hole injected from the first electrode 110 is completely prevented by the first electron transporting layer 150, light is not emitted from the red common emission layer 146 or the green common emission layer 144, and only the blue common emission layer 142 emits light.

As illustrated in FIG. 2D, the hole injected from the first electrode 110 and the electron injected from the second electrode 160 are combined to simultaneously form the exciton in the common emission layers, namely, the blue common emission layer 142, the green common emission layer 144, and the red common emission layer 146, thereby emitting white light. At this time, since the hole injected from the first electrode 110 and the electron injected from the second electrode 160 are not prevented in transfer, and all of the common emission layers emit light.

To provide a detailed description, an energy band gap of the green common emission layer is greater than that of the red common emission layer, and less than that of the blue common emission layer. That is, an electron and a hole are first combined to emit light in a layer having a broad energy band gap, and then, when an electron and a hole are again combined in a layer having an energy band gap narrower than the broad energy band gap, light may be emitted. However, an electron and a hole are first combined to emit light in a layer having a narrow energy band gap, and then, when an electron and a hole are again combined in a layer having an energy band gap broader than the narrow energy band gap, light cannot be emitted.

Therefore, as in the red pixel area Rp of FIG. 1, in a structure in which the blue common emission layer, the green common emission layer, the third hole transporting layer, and the red common emission layer are sequentially stacked between the first and second electrodes 110 and 160, an electron and a hole are combined to emit light in the red common emission layer, and then, as electron transfer is prevented in the third hole transporting layer, light is not emitted from the green and blue common emission layers.

Moreover, as in the green pixel area Gp of FIG. 1, in a structure in which the blue common emission layer, the second hole transporting layer, the green common emission layer, the second electron transporting layer, and the red common emission layer are sequentially stacked between the first and second electrodes 110 and 160, an electron and a hole are combined to emit light in the green common emission layer, and then, light is not emitted from the blue common emission layer having a broad energy band gap.

Moreover, as in the blue pixel area Bp of FIG. 1, in a structure in which the blue common emission layer, the first electron transporting layer, the green common emission layer, and the red common emission layer are sequentially stacked between the first and second electrodes 110 and 160, an electron and a hole are combined to emit light in the blue common emission layer, and then, as hole transfer is prevented in the first electron transporting layer, light is not emitted from the green and red common emission layers.

Moreover, as in the white pixel area Wp of FIG. 1, in a structure in which the blue common emission layer, the green common emission layer, and the red common emission layer are sequentially stacked between the first and second electrodes 110 and 160, an electron and a hole are combined to emit light in all of the common emission layers.

Figure 3:
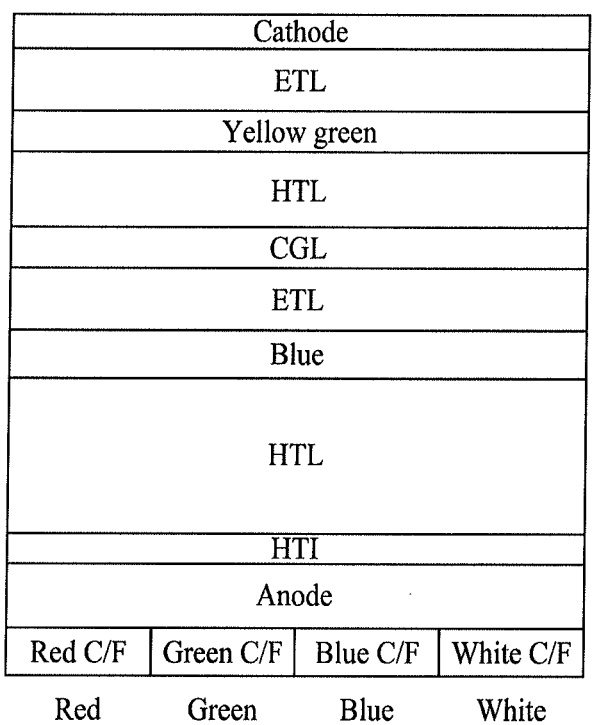
FIGS. 3 to 6 are sectional views schematically illustrating organic light emitting display devices according to a comparative example and an example.
Figure 4:
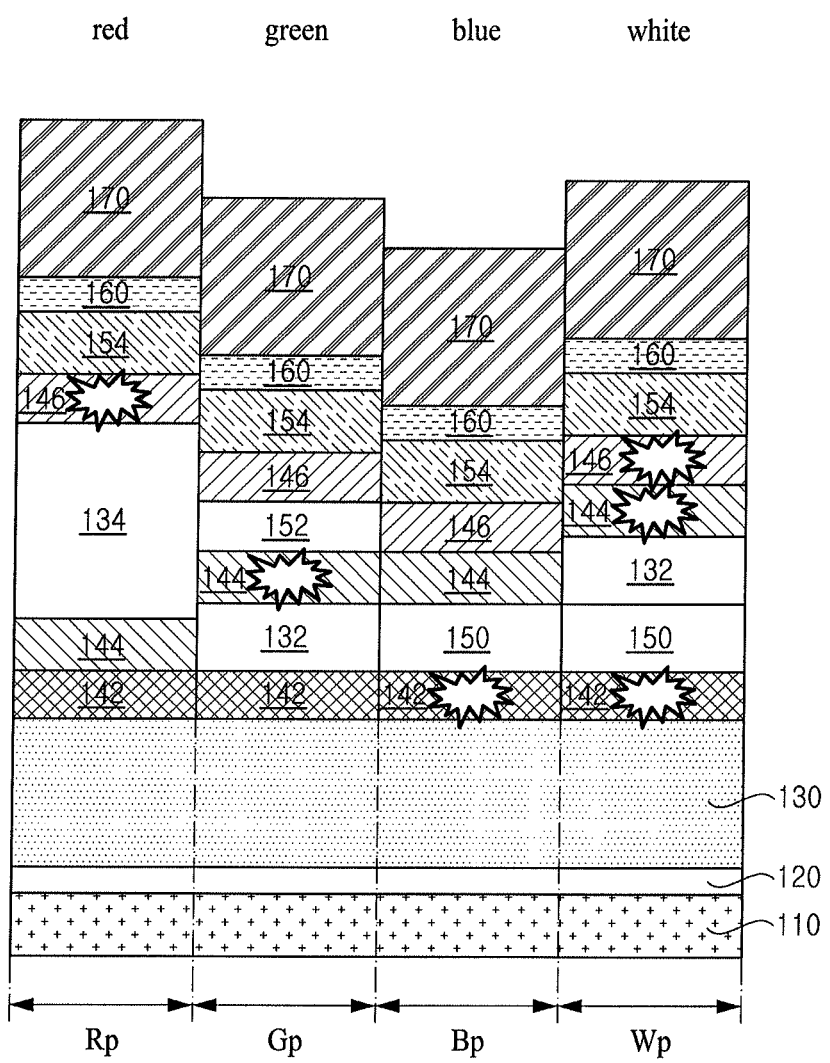
Figure 5:
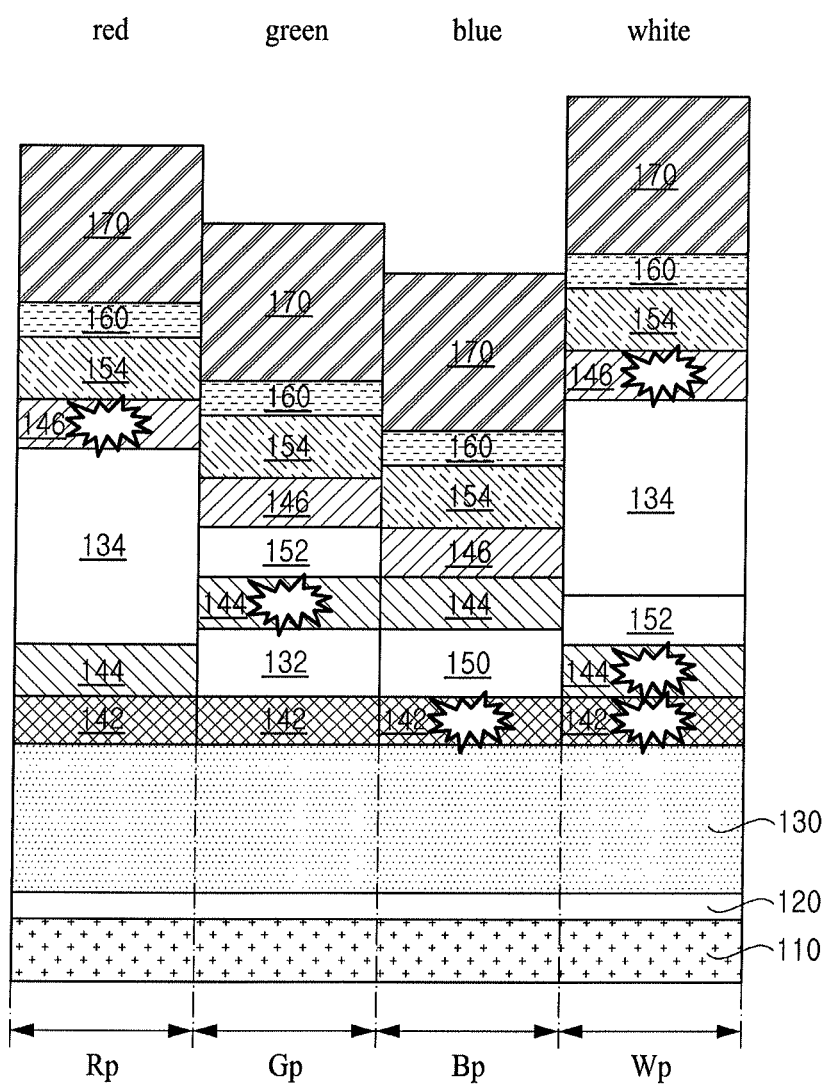
Figure 6:
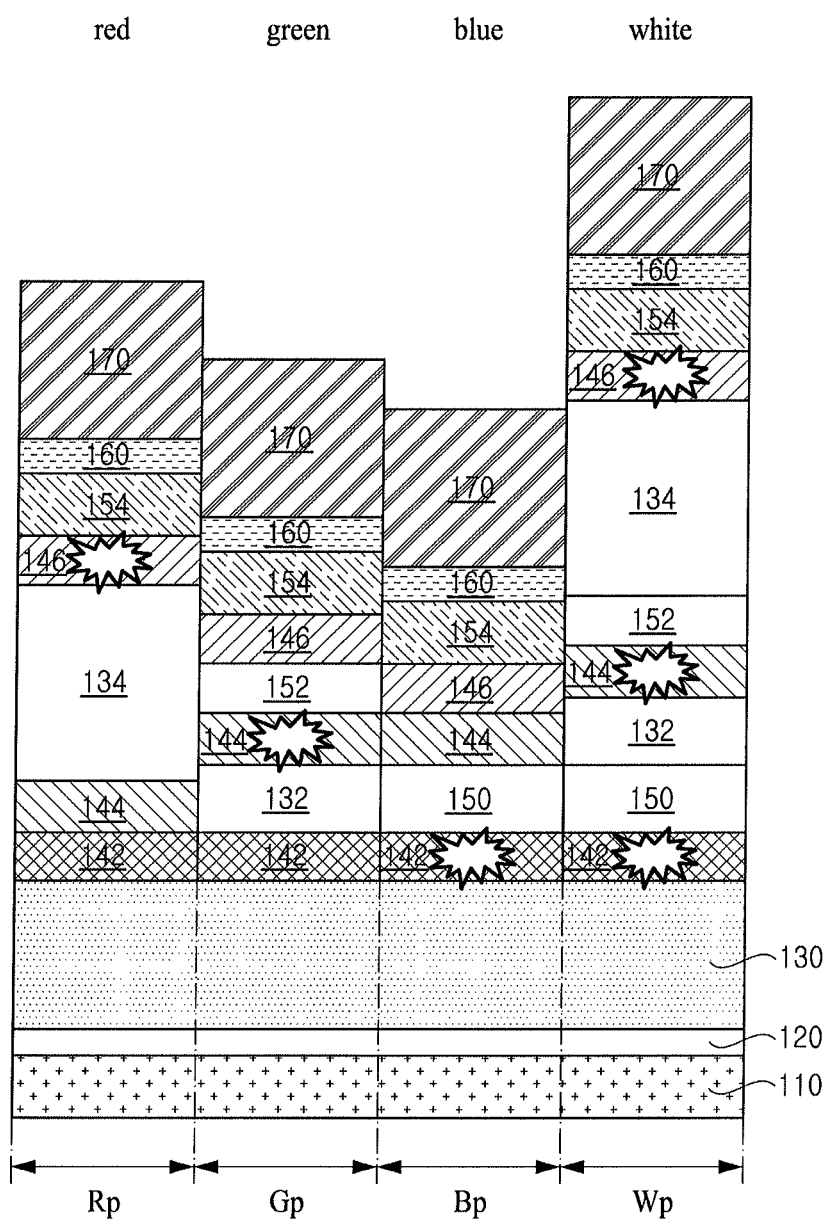

FIGS. 3 to 6 are sectional views schematically illustrating organic light emitting display devices according to a comparative example and an example. Here, FIG. 3 illustrates a structure of a comparative example 1, FIG. 4 illustrates a structure of an example 2, FIG. 5 illustrates a structure of an example 3, and FIG. 6 illustrates a structure of an example 4.

First, Table 1 compares color coordinates and efficient characteristic of a comparative example 1 (the organic light emitting display device of FIG. 3) with color coordinates and efficient characteristic of an example 1 (the organic light emitting display device of FIG. 1).

That is, a comparative example 1 having the following structure is evaluated for comparing the characteristic of the organic light emitting display device according to an embodiment (example 1) of the present invention. A comparative example 1 has a structure in which white light is emitted using a red color filter (red C/F), a green color filter (green C/F), and a blue color filter (blue C/F).

TABLE 1

| Structure | Efficient characteristic (cd/A) of OLED | R | | | G | | | B | | | W | | |
| --- | --- | --- | --- | --- | --- | --- | --- | --- | --- | --- | --- | --- | --- |
| | | cd/A | x | y | cd/A | x | y | cd/A | x | y | cd/A | x | y |
| Comparative example 1 | 22.5 | 6.10 | 0.667 | 0.328 | 24.1 | 0.277 | 0.667 | 2.4 | 0.143 | 0.058 | 74 | 0.342 | 0.383 |
| Example 1 | 24.5 | 55.0 | 0.662 | 0.336 | 110.0 | 0.287 | 0.685 | 5.5 | 0.143 | 0.045 | 26 | 0.311 | 0.400 |

As shown in Table 1, it can be seen that there is hardly a color characteristic difference between the organic light emitting display device (example 1) according to one embodiment of the present invention and a comparative example 1, and an efficient characteristic of the organic light emitting display device (example 1) according to one embodiment of the present invention is improved compared to a comparative example 1.

Next, Table 2 compares color coordinates and efficient characteristics of a comparative example 1 (the organic light emitting display device of FIG. 3) and examples 2 to 4 (the organic light emitting display devices of FIGS. 4 to 6).

TABLE 2

| Structure | Efficient characteristic (cd/A) of OLED | R cd/A | x | y | G cd/A | x | y | B cd/A | x | y | W cd/A | x | y |
|---|---|---|---|---|---|---|---|---|---|---|---|---|---|
| Comparative example 1 | 22.5 | 6.1 | 0.667 | 0.328 | 24.1 | 0.277 | 0.667 | 2.4 | 0.143 | 0.058 | 74 | 0.342 | 0.383 |
| Example 2 | 40.2 | 55 | 0.662 | 0.336 | 110 | 0.287 | 0.685 | 5.5 | 0.143 | 0.045 | 55 | 0.304 | 0.407 |
| Example 3 | 38.4 | 55 | 0.662 | 0.336 | 110 | 0.287 | 0.685 | 5.5 | 0.143 | 0.045 | 50 | 0.312 | 0.399 |
| Example 4 | 49.8 | 55 | 0.662 | 0.336 | 110 | 0.287 | 0.685 | 5.5 | 0.143 | 0.045 | 80 | 0.307 | 0.404 |

As shown in Table 2, it can be seen that there is hardly a color characteristic difference between the organic light emitting display devices (examples 2 to 4) according to another embodiment of the present invention and a comparative example 1, and efficient characteristics of the organic light emitting display devices (examples 2 to 4) according to another embodiment of the present invention are improved compared to a comparative example 1.

Therefore, although the red, green, and blue common emitting material layers are stacked as a common layer, the organic light emitting display device according to one embodiment of the present invention can maintain a color characteristic and realize a high-quality and high-efficiency image.

In the specification, a top emission type organic light emitting display device (OLED) has been exemplified, but the spirit and scope of the present invention are not limited thereto. The present invention may be applied to organic light emitting display devices having various types such as a bottom emission type, a dual emission type, a tandem type, etc.

As described above, by realizing the structure which emits red, green, blue, and white light by forming the red, green, and blue emitting material layers as the common layer, the present invention realizes excellent light output efficiency, and maintains a color characteristic. That is, it is not required to form a separate emitting material layer in each pixel area, and thus, the emitting material layer is formed without using an FMM. Accordingly, color mixture is prevented, limitations due to a defective mask are overcome, a process is simplified, and the manufacturing cost is saved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing an organic light emitting display device, comprising:
   forming an anode electrode on a substrate;
   forming a cathode electrode opposite to the anode electrode;
   forming a blue common emission layer across each of red, green, blue and white subpixel areas above and adjacent to the anode electrode;
   forming a green common emission layer across each of red, green, blue and white subpixel areas above the blue common emission layer;
   forming a red common emission layer across each of red, green, blue and white subpixel areas above the green common emission layer and adjacent to the cathode electrode; and
   sequentially stacking the blue common emission layer, the green common emission layer and the red common emission layer in a respective order in the white subpixel area without having an intermediate layer, such that a blue light, a green light and a red light are emitted, whereby a white light is output from the white subpixel area.

2. The method of claim 1, wherein the step of forming the blue common emission layer comprises forming the blue common emission layer without using a fine metal mask (FMM) process.

3. The method of claim 2, wherein the step of forming the green common emission layer comprises forming the green common emission layer without using the fine metal mask (FMM) process.

4. The method of claim 3, wherein the step of forming the red common emission layer comprises forming the red common emission layer without using the fine metal mask (FMM) process.

5. The method of claim 1, further comprising the step of forming an electron blocking layer in the red subpixel area between the green common emission layer and the red common emission layer with a FMM process.

6. The method of claim 1, further comprising the step of forming an electron blocking layer in the green subpixel area between the green common emission layer and the blue common emission layer with a FMM process.

7. The method of claim 6, further comprising the step of forming a hole blocking layer in the green subpixel area between the green common emission layer and the red common emission layer with the FMM process.

8. The method of claim 1, further comprising the step of forming a hole blocking layer in the blue subpixel area between the green common emission layer and the blue common emission layer with a FMM process.

9. The method of claim 1, further comprising the step of forming a hole injection layer and a hole transporting layer between the anode electrode and the blue common emission layer.

10. The method of claim 1, further comprising the step of adjusting a thickness of layers stacked in at least one of the red, green, blue and white subpixel areas between the anode electrode and the cathode electrode.

11. The method of claim 10, wherein the thickness of layers stacked in the red subpixel area differs from at least one of thickness of layers stacked in the blue, green, or white subpixels between the anode electrode and the cathode electrode.

12. The method of claim 1, further comprising forming a capping layer on the cathode electrode.

* * * * *